United States Patent
Aoki et al.

(10) Patent No.: US 10,586,764 B2
(45) Date of Patent: Mar. 10, 2020

(54) SEMICONDUCTOR PACKAGE WITH PROGRAMMABLE SIGNAL ROUTING

(71) Applicant: INTEL CORPORATION, Santa Clara, CA (US)

(72) Inventors: Russell S. Aoki, Tacoma, WA (US); Dimitrios Ziakas, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/072,219

(22) PCT Filed: Mar. 31, 2016

(86) PCT No.: PCT/US2016/025154
§ 371 (c)(1),
(2) Date: Jul. 24, 2018

(87) PCT Pub. No.: WO2017/171772
PCT Pub. Date: Oct. 5, 2017

(65) Prior Publication Data
US 2019/0035729 A1    Jan. 31, 2019

(51) Int. Cl.
*H01L 23/522* (2006.01)
*H01L 23/498* (2006.01)
(Continued)

(52) U.S. Cl.
CPC ...... *H01L 23/5226* (2013.01); *H01L 21/7682* (2013.01); *H01L 21/823493* (2013.01); *H01L 23/145* (2013.01); *H01L 23/345* (2013.01); *H01L 23/49822* (2013.01); *H01L 23/49827* (2013.01); *H01L 23/5382* (2013.01);
(Continued)

(58) Field of Classification Search
CPC .................................................. H01L 23/5382
See application file for complete search history.

(56) References Cited

U.S. PATENT DOCUMENTS

| | | | |
|---|---|---|---|
| 4,764,644 A * | 8/1988 | Reisman ............... | H01L 21/485 174/253 |
| 5,623,160 A * | 4/1997 | Liberkowski ....... | H01L 23/5382 257/209 |
| 5,906,042 A * | 5/1999 | Lan ..................... | H01L 23/5382 257/E23.171 |
| 6,506,981 B1 * | 1/2003 | Liberkowski ....... | H01L 23/5382 174/261 |

(Continued)

OTHER PUBLICATIONS

International Search Report issued in PCT/US2016/025154, dated Nov. 21, 2016, 2 pages.

*Primary Examiner* — David A Zarneke
(74) *Attorney, Agent, or Firm* — Eversheds Sutherland (US) LLP

(57) ABSTRACT

Semiconductor packages with programmable routing pathways are disclosed. The semiconductor package may have a source trace that may be electrically coupled to two or more different electrical pathways, where any of the electrical pathways may be activated to provide an electrical connection between the source trace and one or more destination nodes. Each of the electrical pathways may have a corresponding metal well with a correspond airgap overlying the metal well, as well as corresponding heating elements. If a particular heating element is energized, the heating element may melt metal in a corresponding metal well and the molten metal may migrate by capillary action into the overlying airgap to complete an electrical connection between the source trace and a destination node.

20 Claims, 11 Drawing Sheets

(51) Int. Cl.
  *H01L 23/538* (2006.01)
  *H01L 23/14* (2006.01)
  *H01L 21/768* (2006.01)
  *H01L 21/8234* (2006.01)
  *H01L 21/34* (2006.01)
  *H01L 23/00* (2006.01)
  *H01L 23/34* (2006.01)

(52) U.S. Cl.
  CPC .............. *H01L 24/09* (2013.01); *H01L 24/13* (2013.01); *H01L 24/16* (2013.01); *H01L 2224/13111* (2013.01); *H01L 2224/13147* (2013.01); *H01L 2224/16225* (2013.01); *H01L 2924/15192* (2013.01); *H01L 2924/15311* (2013.01)

(56) References Cited

U.S. PATENT DOCUMENTS

| | | | |
|---|---|---|---|
| 2003/0107105 A1* | 6/2003 | Kozicki | G11C 11/34 257/529 |
| 2003/0206405 A1* | 11/2003 | Zu | H01L 23/49822 361/792 |
| 2007/0222059 A1* | 9/2007 | Roberts | H05K 1/0262 257/691 |
| 2010/0019346 A1* | 1/2010 | Erturk | H01L 23/645 257/531 |
| 2013/0168841 A1* | 7/2013 | Zhao | H05K 1/029 257/676 |
| 2014/0291802 A1* | 10/2014 | Adderly | H01L 28/60 257/532 |

* cited by examiner

SEMICONDUCTOR PACKAGE WITH PROGRAMMABLE SIGNAL ROUTING

CROSS-REFERENCE TO RELATED APPLICATION(S)

This application is a U.S. National Stage Application under 35 U.S.C. 371 and claims the priority benefit of International Application No. PCT/US16/25154, filed Mar. 31, 2016, which is incorporated herein by reference as if set forth in full.

TECHNICAL FIELD

This disclosure generally relates to semiconductor packages, and more particularly to semiconductor packages with programmable signal routing.

BACKGROUND

Integrated circuit(s) and other electronic devices that are packaged on a semiconductor package may have a variety of selectable connections to provided variations of functionality and/or user-specific configurations. Often times several variations of similar packages may be used and/or warehoused to provide relatively small variations in on-package routing. Fabricating, cataloging, and placing in inventory may result in additional expenses and potentially holding a relatively larger volume of inventory of parts.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1:
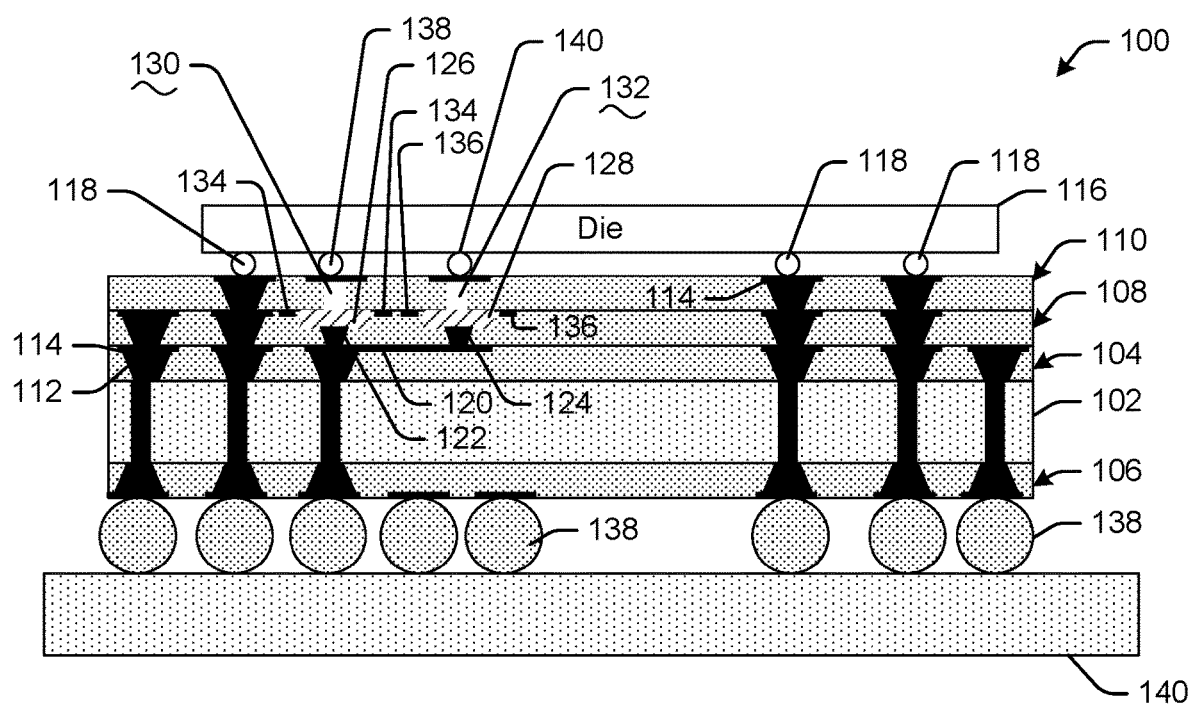
FIG. 1 depicts a simplified cross-sectional schematic diagram of an example semiconductor package with programmable signal routing, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure, and it is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the invention are semi-diagrammatic and not to scale and, particularly, some of the dimensions are for the clarity of presentation and may be exaggerated in the drawings. In addition, where multiple embodiments are disclosed and described having some features in common, for clarity and ease of illustration, description, and comprehension thereof, similar and like features one to another will ordinarily be described with like reference numerals even if the features are not identical.

The term "horizontal" as used herein may be defined as a direction parallel to a plane or surface (e.g., surface of a substrate), regardless of its orientation. The term "vertical," as used herein may refer to a direction orthogonal to the horizontal direction as just described. Terms, such as "on", "above", "below", "bottom", "top", "side" (as in "sidewall"), "higher", "lower", "upper", "over", and "under", may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

In example embodiments, semiconductor package structures may include selectable and/or programmable routing. This type of selectable routing may be used for having a particular semiconductor package accommodating variations of one or more integrated circuits disposed thereon, or for selecting between multiple dies to be connected on a semiconductor package. In example embodiments, the routing selection may be performed prior to usage of the of the semiconductor package structure. For example, a routing selection process and/or programming (e.g., a routing burn-in) may be performed before and/or while the semiconductor package is provided in a product. In some example embodiments, the routing selection may be performed at a manufacturing site (e.g., where semiconductor package is manufactured), at an original equipment manufacturer (OEM) site, or by a customer. The routing selection may be of signals, ground, power, and/or clock signals that are provided to different nodes, either of the same die or of different dies.

The routing selection, according to apparatus, systems, and methods, as disclosed herein, may be enabled by having two or more pads and/or traces that are connectable to a source signal trace. The source signal trace may be connected to metal wells, such as solder wells, corresponding to each signal route. Each signal route may have a corresponding cavity (e.g., airgap) underlying each of the connectable traces and/or pads and above their corresponding metal wells. The semiconductor package may further have corresponding heating elements in relative proximity of each of the metal wells. The heating elements may be selectably energized to generate sufficient heat to melt the metal (e.g. solder) within only the metal well corresponding to the selected pathway, but none of the other metal wells. Therefore, the heating elements corresponding to the desired one of the two or more pads and/or traces may be energized to melt metal in the corresponding metal well. The molten metal, at this point may migrate, such as by capillary and/or Van der Waals forces, into the airgap overlying the metal well for which the corresponding heating elements have been energized. In example embodiments, the molten metal may migrate a distance in the airgap such that the pad and/or trace of the path selected may be shorted to the source trace by molten metal. The heating elements may be de-energized, at which point, the molten metal may solidify in a position such that the now solid metal may provide an electrical pathway between the selected pad and/or trace and the source trace. Selecting and/or programming may be used herein interchangeably as the process of melting the metal in the selected pathway to provide a particular desired electrical routing pathway.

In some example embodiments, sidewall surfaces of the airgap may be surface treated, such as by roughening and/or a thin metal and/or dielectric coating to enhance Van der Waals forces (e.g., enhance wetting of the surface by the molten metal). The airgap may be suitably sized (e.g., height, width, and/or diameter) such that the molten metal may effectively rise the height of the airgap to provide conduction along the selected routing. In some example embodiments, the airgap may be formed in a relative vacuum environment such that there may be reduced mechanical impediment due to air pressure when the molten metal migrates in the airgap. In further example embodiments, the metal in the metal well may be selected to have a lower melting point than other metal that may be proximal to the heating elements, such that when the heating element is powered, unintended metal (e.g., flip-chip interconnects) is not molten. In some example embodiments, the airgap linings, the source signal traces, and/or the connectable pads and/or traces may have a metallurgy such that during the molten metal migration and connection forming, an intermetallic and/or alloy compound may be formed such that the intermetallic (e.g., Sn—Cu intermetallic) and/or alloy compound may have a melting point that is greater than the melting point of the metal in the metal well.

In example embodiments, the semiconductor package with programmable signal routing may include a package substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. The build-up layers, as built up on the core, may have interconnects formed therein. The interconnects may provide electrical pathways for signals between electronic components (e.g., integrated circuits, passive devices, etc.), input/output (I/O) connections on the semiconductor package, signal fan-out from/to the electronic components, signal connections between two or more electrical components, power delivery to electrical component (s), ground connections to electrical component(s), clock signal delivery to the electrical component(s), combinations thereof, or the like. The build-up layers may be fabricated on one or both sides of the package core. In some cases, there may be the same number of build-up layers on both sides of the package core. In other cases, the build-up layers formed on either side of the package core may be asymmetric. Furthermore, the core of the semiconductor package may have a plurality of through vias to make electrical connections from one side of the core to the other side of the core. Thus, through-vias in the core may allow electrical connections between one or more build-up layers on the top of the semiconductor package to one or more build up layers on the bottom of the semiconductor package.

One or more electronic components, such as integrated circuit die, may be electrically and mechanically coupled to the package substrate via any suitable mechanism, such as metal pillar (e.g., copper pillar), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the build-up layers on the bottom of the core may have one or more input/output (I/O) connections between the semiconductor package and a board. Semiconductor package-to-board level interconnects may be provided on one or both sides of the package substrate. In example embodiments, the semiconductor package-to-board level connections may be ball grid array (BGA) connections, other area connections, periphery connections, or the like.

Embodiments of the disclosure may provide a semiconductor package with programmable signal routing and a method for fabrication of the semiconductor package with programmable signal routing. In example embodiments, one or more build-up layers (e.g., prepreg layers) of a package substrate may be fabricated. A source trace may be provided on the last build-up layer fabricated. In some cases, source vias, corresponding to each signal route may be formed on the source trace. A cavity or well may be formed corresponding to each of the signal routes. Each of these cavities or wells may be formed on the corresponding source vias and/or on the source trace. The cavities may be formed by any suitable process, such as laser ablation and/or etch. Metal may be provided in each of the wells by any suitable mechanism, such as screen printing metal paste, plating, metal paste squeegee, to form each of the metal wells. The metal may be any suitable metal, such as solder, lead-free solder, tin alloys, or the like.

The build-up layer within which the metal wells are formed may have metal traces that may serve as heating elements. In example embodiments, the heating elements may be fabricated at the same time as other traces of that build-up layer. The heating elements may have a relatively small cross-section in a direction normal to current flow relative to other metal lines that may be disposed in that build-up layer, such that the heating elements may have a suitably high resistance to generate a sufficient amount of heat to melt metal in the metal wells corresponding to the heating elements. In some example embodiments, the heating elements may, at least partially, surround a corresponding metal well. For example, on a particular build-up layer, the metal well may be round and the heating element may be disposed in the same metal layer partially surrounding and in relative proximity of the metal well. During programming and/or signal route selection, prior to usage of the semiconductor package in an electronic device (e.g., smartphone), power may be provided to the heating elements via pads on a top surface (e.g., surface on which electronic components are mounted). One or more probes, such as pogo-probes, may provide power to heating elements, in example embodiments. In other example embodiments, power may be provided to the heating elements via electrical traces of the semiconductor package from a board (e.g., printed circuit board (PCB)) on which the semiconductor package may be mounted.

FIG. 1 depicts a simplified cross-sectional schematic diagram of an example semiconductor package with programmable signal routing 100, in accordance with example embodiments of the disclosure. The semiconductor package may include a core 102 and one or more build-up layers 104, 106, 108, 110 on one or both sides of the core 102. The build-up layers 104, 106, 108, 110 may include one or more vias 112, 120, 122 and/or electrical traces 114, 120, 134, 136 to route signals, ground, power, and/or clock from/to printed circuit board (PCB) 140 via one or more package-to-board interconnects 138. A die 116 may be disposed on a surface of the semiconductor package 100 and connect thereto via one or more die-to-package interconnects 118, 138, 140.

The package core 102 may be of any suitable size and/or shape. For example, the package core 102, in example embodiments, may be a rectangular panel. In example embodiments, the package core may fabricated of any suitable material, including polymer material, ceramic material, plastics, composite materials, glass, epoxy laminates of fiberglass sheets, FR-4 materials, FR-5 materials, combinations thereof, or the like. It will be appreciated that the core 102 may have through vias formed therein. Through vias may be used for propagating electrical signals from the top of the core 102 to the bottom of the core 102, and vice versa.

The build-up layers 104, 106, 108, 110 or interconnect layer may be formed by a variety of suitable processes. Dielectric laminate material may be laminated on the semiconductor substrate core material 102. In example embodiments, the dielectric laminate may be any suitable material, including polymer material, ceramic material, plastics, composite materials, liquid crystal polymer (LCP), epoxy laminates of fiberglass sheets, FR-4 materials, FR-5 materials, combinations thereof, or the like. In some example embodiments, the core 102 and the build-up dielectric may be the same type of material. In other example embodiments, the core 102 and the build-up dielectric may not be constructed of the same material types. The vias 112, 122, 124 and/or trenches 114, 120 may be patterned in the build-up layer using any suitable mechanism, including photolithography, plasma etch, laser ablation, wet etch, combinations thereof, or the like. The vias 112, 122, 124 and trenches 114, 120 may be defined by vertical and horizontal metal traces, respectively within the build-up layer. The vias 112, 122, 124 and trenches 114, 120 may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

Although for illustrative purposes only one die 116 is shown on the semiconductor package 100, it will be appreciated that there may be any suitable number of electronic components disposed in each semiconductor package with programmable signal routing 100, in accordance with example embodiments of the disclosure. The dies 116 may be any suitable electronic components, including, but not limited to, integrated circuits, surface mount devices, active devices, passive devices, diodes, transistors, connectors, resistors, inductors, capacitors, microelectromechanical systems (MEMS), combinations thereof, or the like. The electronic components may be electrically and mechanically coupled to the package substrate via any suitable mechanism, such as metal pillar (e.g., copper pillar), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like.

The trace 120 may be a common source trace that may be electrically connected to via 120 of a first potential route and via 122 of a second potential route. If the pathway through via 122 is established, then a route through die-to-package interconnect 138 may be established to the die 116. On the other hand, if the pathway through via 124 is established, then a route through die-to-package interconnect 140 may be established to the die 116. In this way, one of two pathways may be established on the semiconductor package 100 based at least in part on activation of one of the two pathways. To establish the pathway through via 120 to node 138, the metal in metal well 126 may be melted by activating the heating elements 134. On the other hand, to establish the pathway through via 122 to node 140, the metal in metal well 128 may be melted by activating the heating elements 136.

Figure 2A:
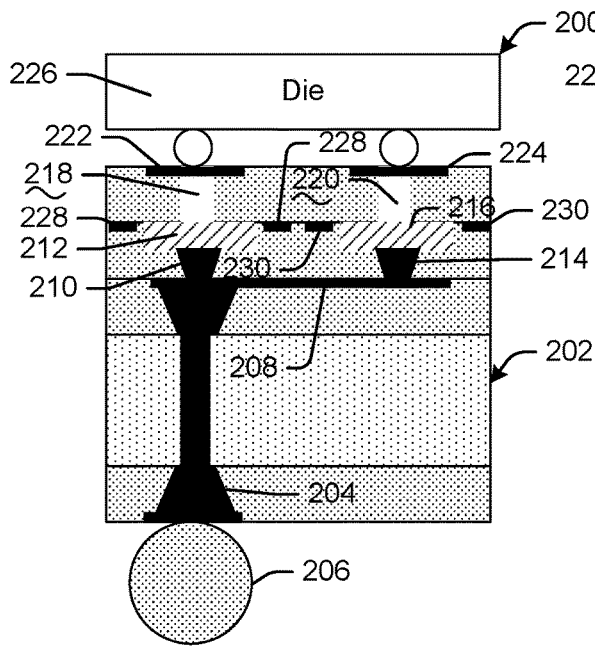
FIGS. 2A-2D depict simplified cross-sectional schematic diagrams illustrating a time series for forming a routing pathway in the semiconductor package with programmable routing of FIG. 1, in accordance with example embodiments of the disclosure.

FIGS. 2A-2D depict simplified cross-sectional schematic diagrams illustrating a time series for forming a routing pathway in the semiconductor package 200, 240, 250, 260 with programmable routing of FIG. 1, in accordance with example embodiments of the disclosure. FIG. 2A depicts the semiconductor package 200 with package substrate 202, vias 204, metallic traces 208 connected to a package-to-board interconnect 206 prior to activating either heating elements 228, 230. The semiconductor package 200 may further have a common source trace 208 connected to via 210 and via 214. There may be a metal well 212 disposed over via 210 and there may be a metal well 216 disposed over via 214. There may further be a cavity or gap 218 over the metal well 212 and gap 220 over the metal well 216. Heating element 228 may be provided to melt metal in metal well 212 to fill gap 218 to connect source trace 208 to pad 222.

Figure 2B:
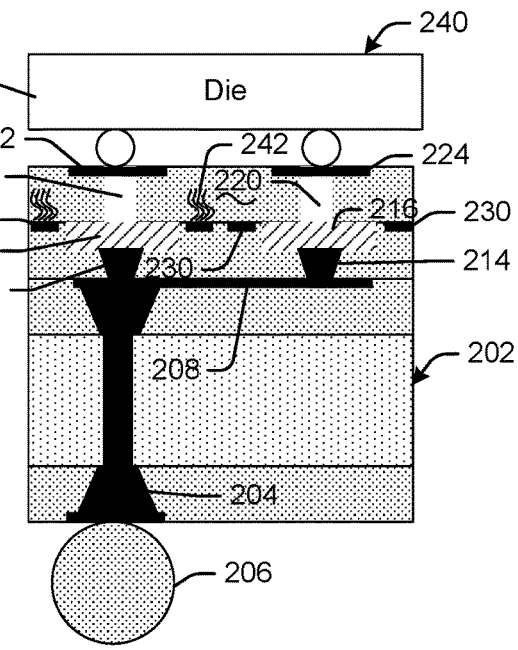
Figure 2C:
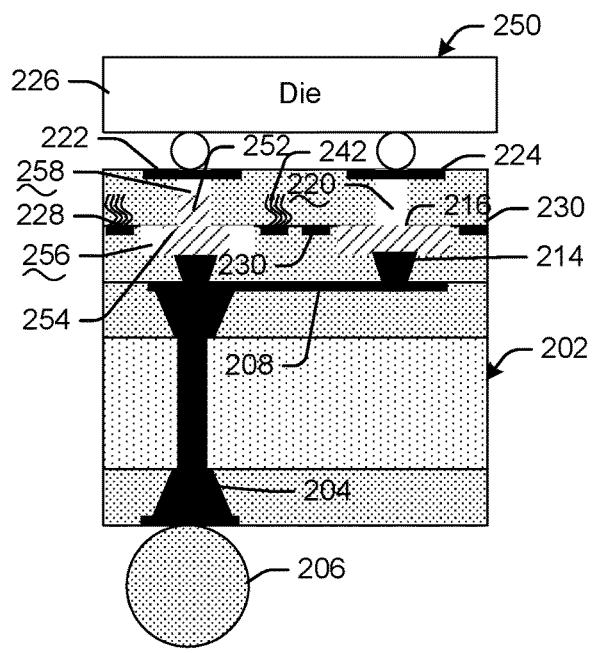
Figure 2D:
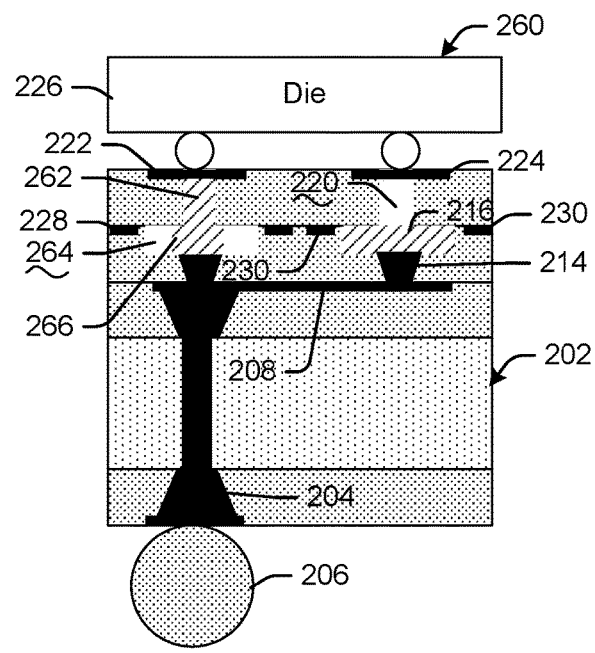

In FIG. 2B, semiconductor package 240 may have heating element 228 energized, or in other words be powered, as indicated by depiction of heat 242. As the heating element 228 generates heat, some of the thermal energy may be absorbed by the metal well 212. As the metal well 212 absorbs thermal energy and starts rising in temperature, at some point the metal well 212 may reach the melting point of the metal in the metal well 212. At this point, the metal in the metal well 212 may begin melting. In FIG. 2C, some of the metal in the metal well 212 may melt and start migrating into the gap 218 overlying the metal well 212. Due to the metal migration, the gap may narrow to gap 258 as a portion of metal 252 fills part of the gap 212. A reduced volume of metal 254 may remain in the well and voids 256 may be present as some of the metal leaves the well. The heat 242 may still be on to keep the metal molten and drive the capillary action to drive the metal to contact the overlying pad 222 of the selected route. In FIG. 2D, semiconductor package 260 may have the heating 242 turned off by de-energizing the heating element 228 after the metal 262 has made an electrical contact between pad 222 and via 210 and/or source trace 208. There may be some metal 266 remaining in the well and there may further be voids 264 within the well from where metal has migrated during the formation of metal connection 262 between pad 222 and via 210 and/or source trace 208. Thus, it can be seen how, by programming the semiconductor package 200, one of the two pathways may be selected and electrically completed, such that package-to-board interconnect 206 may be electrically contacted with the pad 222, while there may be no electrical pathway between the package-to-board interconnect 206 and the pad 224.

Figure 3A:
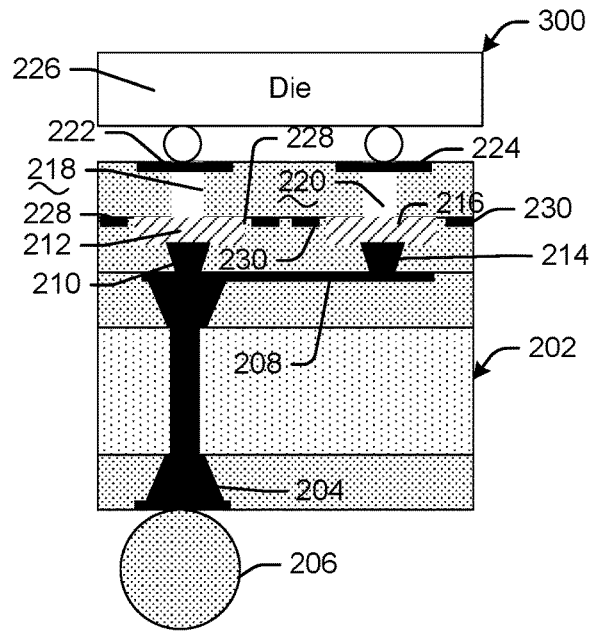
FIGS. 3A-3D depict simplified cross-sectional schematic diagrams illustrating a time series for forming a different routing pathway than in FIGS. 2A-2D in the semiconductor package with programmable routing of FIG. 1, in accordance with example embodiments of the disclosure.
Figure 3B:
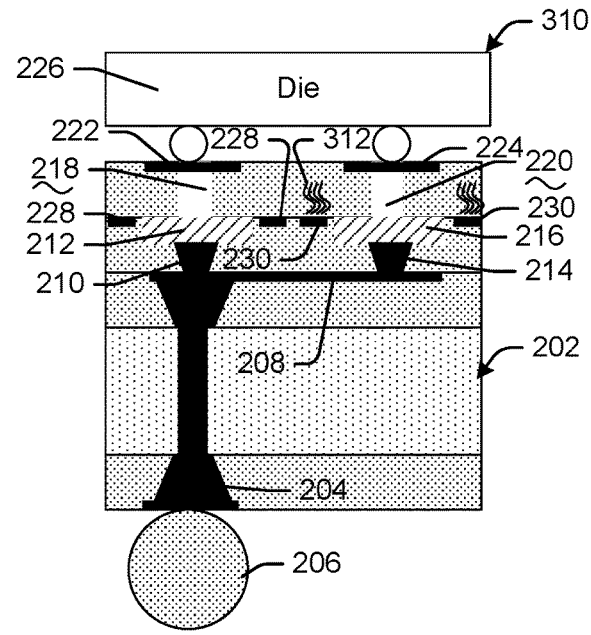
Figure 3C:
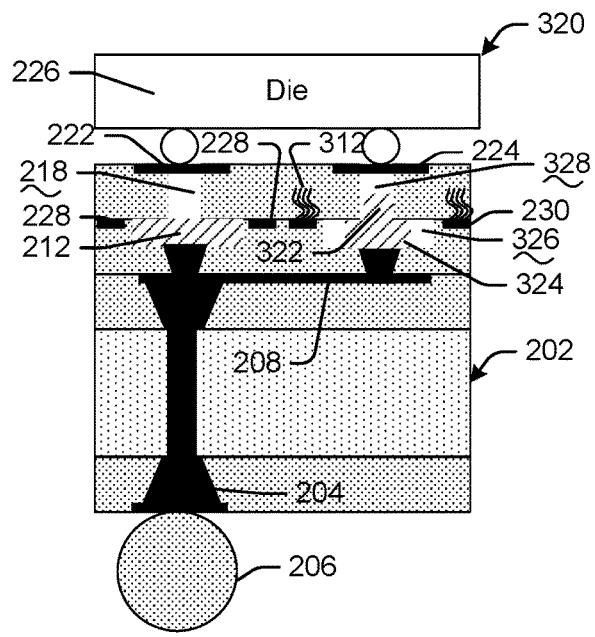
Figure 3D:
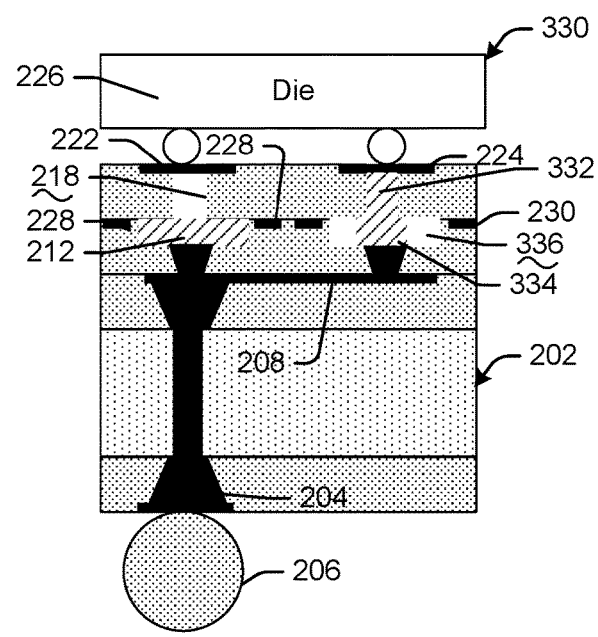

FIGS. 3A-3D depict simplified cross-sectional schematic diagrams illustrating a time series for forming a different routing pathway than in FIGS. 2A-2D in the semiconductor package 300, 310, 320, 330 with programmable routing of FIG. 1, in accordance with example embodiments of the disclosure. Semiconductor package 300 of FIG. 2A may be a similar configuration as semiconductor package 200 of FIG. 2A. It may be decided that the other pathway of package 300 is to be activated. Thus, In FIG. 3B, semiconductor package 310 may have heating element 230 energized, or in other words be powered, as indicated by depiction of heat 312. As the heating element 230 generates heat, some of the thermal energy may be absorbed by the metal well 216. As the metal well 216 absorbs thermal energy and starts rising in temperature, at some point the metal well 216 may reach the melting point of the metal in the metal well 216. At this point, the metal in the metal well 216 may begin melting. In FIG. 3C, some of the metal in the metal well 216 may melt and start migrating into the gap 220 overlying the metal well 216. As a result, the gap may narrow to gap 328 as a portion of metal 322 fills part of the gap 220. A reduced volume of metal 324 may remain in the well and voids 326 may be present as some of the metal leaves the well. The heat 312 may still be on to keep the metal molten and drive the capillary action to drive the metal to contact the overlying pad 224 of the selected route. In FIG. 3D, semiconductor package 330 may have the heating 312 turned off by de-energizing the heating element 230 after the metal 332 has made an electrical contact between pad 224 and via 214 and/or source trace 208. There may be some metal 334 remaining in the well and there may further be voids 336 within the well from where metal has migrated during the formation of metal connection 332 between pad 224 and via 214 and/or source trace 208. Thus, it can be seen how, by programming the semiconductor package 300, the second of the two pathways may be selected and electrically completed, such that package-to-board interconnect 206 may be electrically contacted with the pad 224, while there may be no electrical pathway between the package-to-board interconnect 206 and the pad 222.

Figure 4:
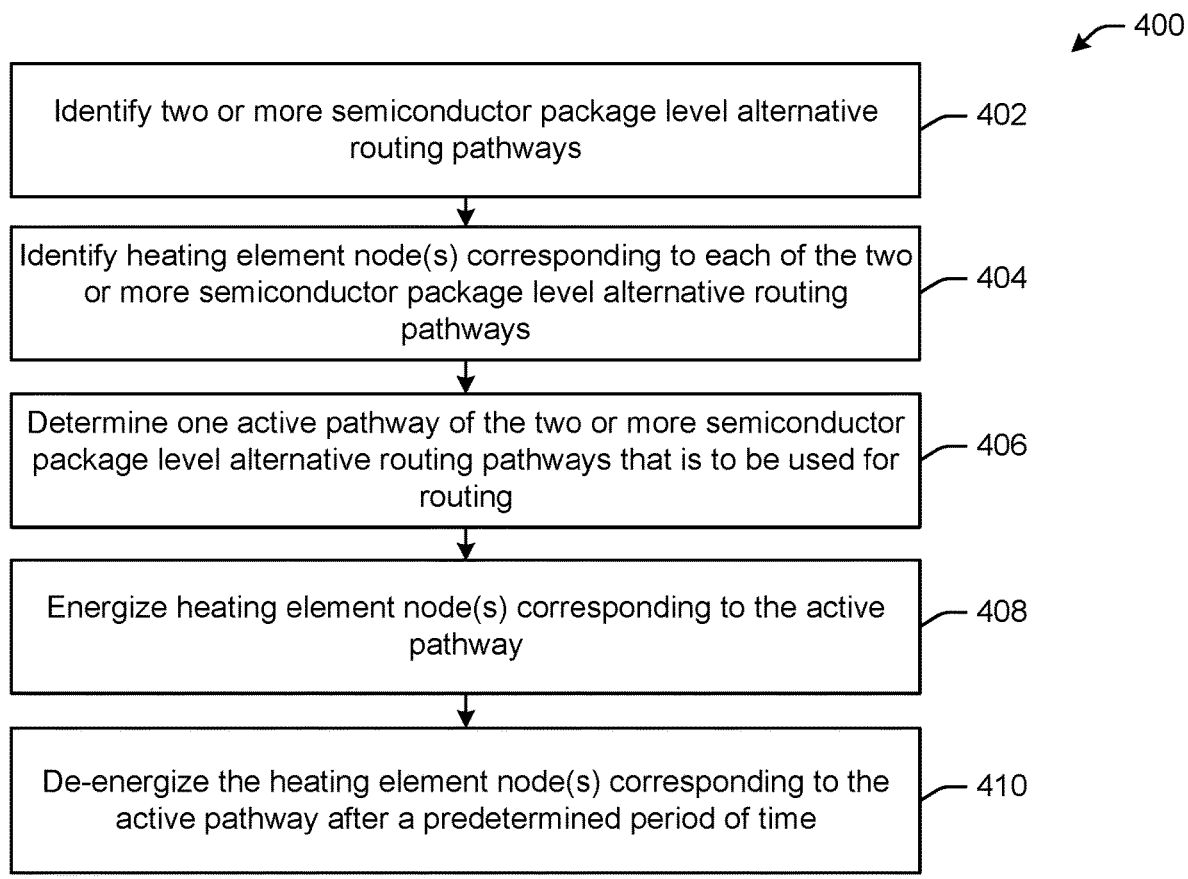
FIG. 4 depicts a flow diagram illustrating an example method for forming a selectable pathway in the semiconductor package with programmable signal routing of FIG. 1, in accordance with example embodiments of the disclosure.

FIG. 4 depicts a flow diagram illustrating an example method 400 for forming a selectable pathway in the semiconductor package with programmable signal routing of FIG. 1, in accordance with example embodiments of the disclosure. The method 400 may be used to program and/or complete a selected electrical pathway on a semiconductor package with programmable signal routing.

At block 402, two or more semiconductor package level alternative routing pathways may be identified. These alternative routings may be provided for making various connections related to various configurations of different die. For example, perhaps different voltage levels for a particular die may be set by which I/O of the die is provided with power. The die and the package may be suitable for various electronic devices, but with a different power levels. For example, the die and the package may operate at a relatively lower power level and relatively lower performance level when used in a smartphone, and may be used at relatively higher power level and relatively higher performance level when used in a server.

At block 404, heating element node(s) corresponding to each of the two of more semiconductor package level alternative routing pathways may be identified. These alternative routings may be provided, in example embodiments, by the manufacturer of the dies and/or semiconductor package on which dies are disposed. At block 406, one active pathway of the two or more semiconductor package level alternative pathways may be determined to be used for routing. Selection of a pathway may be based on the configuration needs of the OEM and/or end customer.

At block 408, heating elements node(s) corresponding to the active pathway may be energized. The electrical connections to heating element nodes may be provided on a surface of the semiconductor package on which electronic components are mounted and may be powered using probes and/or other mechanisms for electrically connecting to surface pads of a semiconductor package. In other example embodiments, the electrical connections to the heating elements may be via package-to-board interconnections. In these example embodiments, the board may be configured to carry a relatively high current load on the traces and/or interconnects that may be used for power delivery to the heating elements.

At block 410, the heating element node(s) corresponding to the active pathway may be de-energized after a predetermined period of time. The heating elements may be energized for the period of time that it would take to reliably flow the molten metal in a channel to make an intended connection to a corresponding pad to select a pathway from among two or more pathways. At this point, the selected pathway may be formed and the semiconductor package may be prepared for being provided and/or operating as intended within an electronic device in which the semiconductor package is to be disposed.

It should be noted, that the method 400 may be modified in various ways in accordance with certain embodiments of the disclosure. For example, one or more operations of method 400 may be eliminated or executed out of order in other embodiments of the disclosure. Additionally, other operations may be added to method 400 in accordance with other embodiments of the disclosure.

Figure 5A:
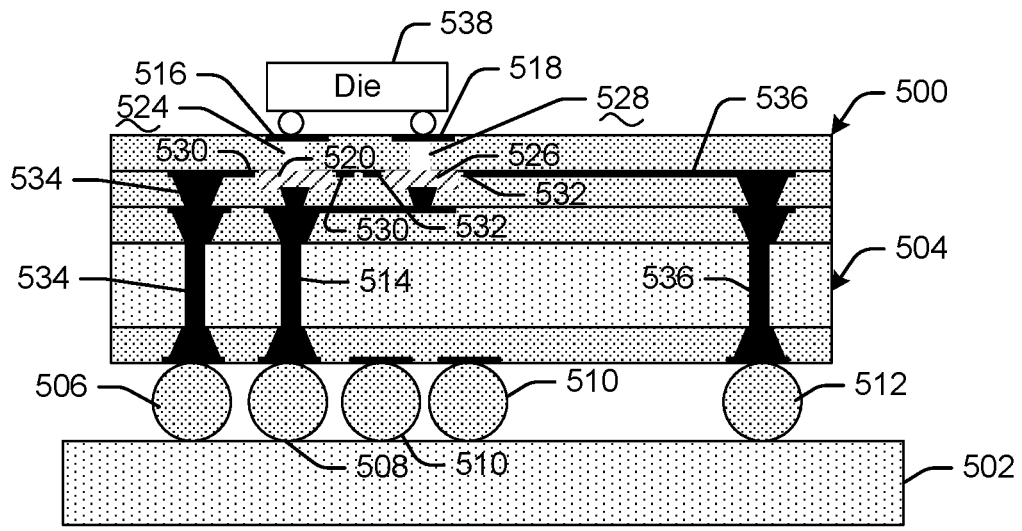
FIGS. 5A-5B depict simplified cross-sectional schematic diagrams of an example semiconductor package with programmable signal routing with mechanisms to provide power to heating elements, in accordance with example embodiments of the disclosure.
Figure 5B:
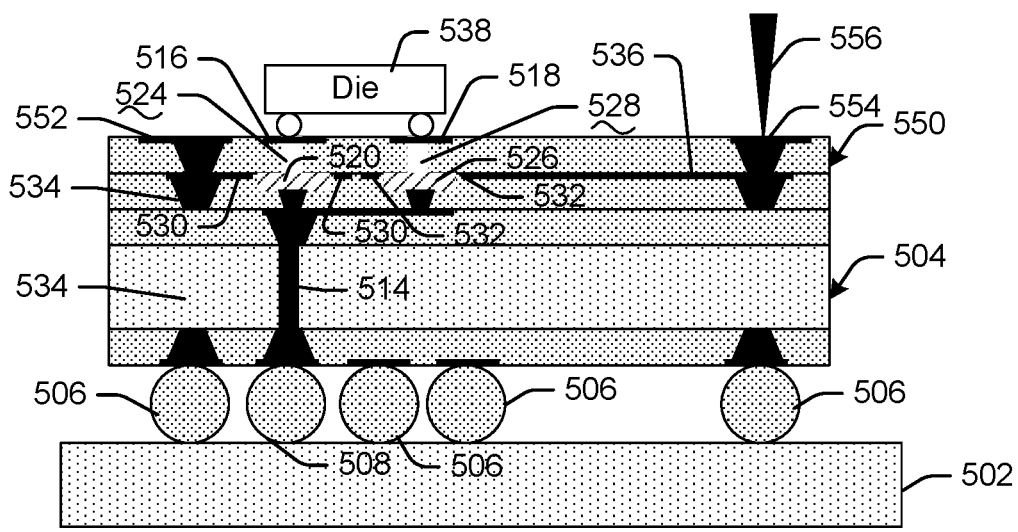

FIGS. 5A-5B depict simplified cross-sectional schematic diagrams of an example semiconductor packages 500, 550 with programmable signal routing with mechanisms to provide power to heating elements 530, 532, in accordance with example embodiments of the disclosure. In FIG. 5A, power may be provided to one of heating elements 530, 532 via a board 502 on which the semiconductor package 500 is disposed. The semiconductor package 500 may have package substrate 504 with electrical pathway 534 to heating element 530 from package-to-board interconnect 506 between semiconductor package 500 and board 502. The semiconductor package 500 may similarly have electrical pathway 536 to heating element 532 from package-to-board interconnect 512. The semiconductor package 500 may further have a common source trace 514 connected to package-to-board interconnect 508. There may be a first metal well 520 corresponding to a first package routing to pad 516 connected to die 538 and there may be a second metal well 526 corresponding to a second package routing to pad 518 connected to die 538. There may further be a first cavity or gap 524 over the first metal well 520 and gap 528 over the second metal well 526. Energizing heating element 530 may result in melting metal in metal well 520 and energizing heating element 532 may result in melting metal in metal well 526. The semiconductor package 500 may have one or more additional package-to-board interconnects 510 that may be ground return paths. Current sufficient to power the heating element 530 may be provided via package-to-board interconnect 506 and electrical pathway 534 if common source trace 514 is to be electrically connected to pad 516. Alternatively, current sufficient to power the heating element 532 may be provided via package-to-board interconnect 512 and electrical pathway 536 if common source trace 514 is to be electrically connected to pad 518.

In FIG. 5B, power may be provided to one of heating elements 530, 532 via one or more probes 556 driving current through one of surface pads 552, 554. As an example, if sufficient current is supplied to the pad 554 from the probe 556, as depicted, then heating element 532 may be activated to melt metal in metal well 526 to form electrical contact between common source trace 514 and pad 518. Alternatively, if current is supplied to surface pad 552, then heating element 530 may be activated and may result in the melting of the metal in metal well 520 to form electrical contact between common source trace 514 and pad 514. It will be appreciated that there may be a ground pad on the surface of the semiconductor package 550 by which the supplied current from probe 556 may return to ground, such as through a ground return probe. Alternatively, one or more contacts 506 to the PCB 502 may be used for ground return of any programming current supplied by probe 556. The probe 556 may be any suitable probe, such as a pogo-probe (e.g., with spring biased telescopic structure), pyramid probe, etc. It will be appreciated that in example embodiments where the metal in the metal wells 520, 526 are solder and/or tin-alloys, the melt temperature may be about 200 degrees. The metal lines and the heating elements 530, 532 may be sized and/or designed such that they do not short out if a sufficient current is pushed such that temperatures of about 200 degrees Celsius or more are achieved in the heating elements 530, 532. Additionally, the dielectrics of the build-up layers may be selected and/or designed to withstand the temperatures at which the metal in the metal wells may melt.

Figure 6:
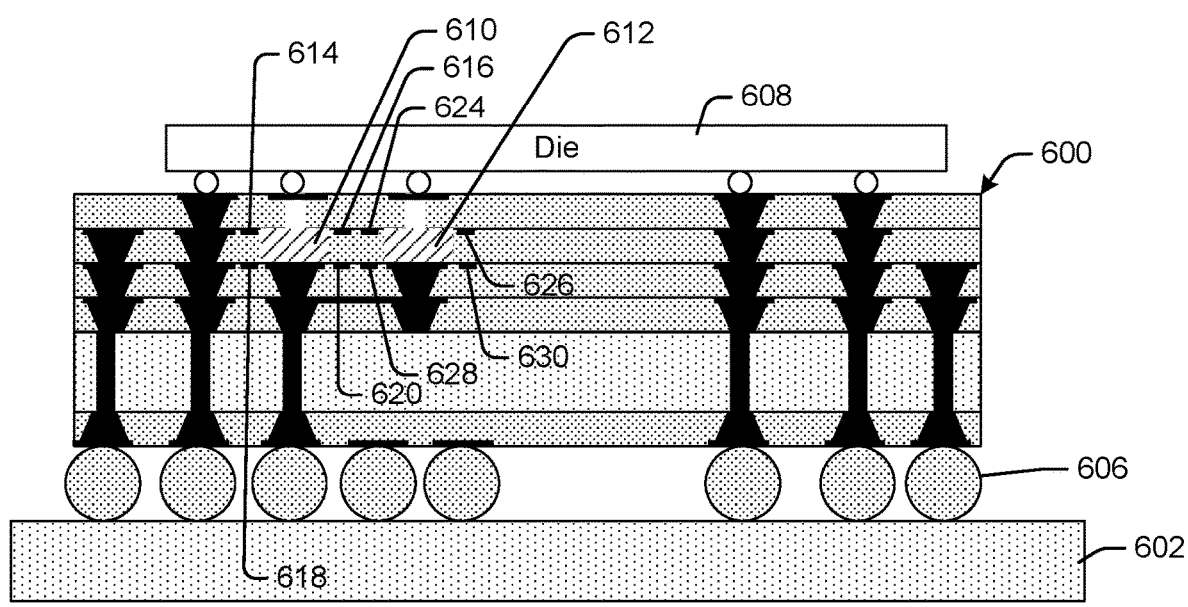
FIG. 6 depicts a simplified cross-sectional schematic diagram of an example semiconductor package with programmable signal routing having four heating elements for each solder well, in accordance with example embodiments of the disclosure.

FIG. 6 depicts a simplified cross-sectional schematic diagram of an example semiconductor package 604 with programmable signal routing having four heating elements 614, 616, 618, 620, 624, 626, 628, 630 for each solder well 610, 612, in accordance with example embodiments of the disclosure. A die 608 may be disposed on the semiconductor package 600 and the semiconductor package 600 may be disposed on a PCB 602 with a plurality of package-to-board interconnects 606. It will be appreciated that is a metal in metal reservoir 610 is to be melted, then heating elements 614, 616, 618, 620 may be energized. On the other hand, if the metal in reservoir 612 is to be melted, then heating elements 624, 626, 628, and 630 may be activated. It will be appreciated that the heating elements in this case may be distributed on two different build-up layers. In some example embodiments, having heating elements distributed along the length of a gap to be filled may result in more distributed heating, resulting in a more distributed temperature profile along the gap. In some cases, the heating elements may be individually driven with current, such as by the mechanisms described in conjunction with FIGS. 5A-5B. In other cases, heating elements on a particular build-up layer and corresponding to a particular metal well may be driven together. In still other cases, the heating elements of a particular metal well may be driven together, such as by the mechanisms described in conjunction with FIGS. 5A-5B. It will also be appreciated that the metal wells 610, 612 extend a full depth of a build-up layer. It will further be appreciated that in alternative embodiments, the metal depth may extend a fraction of, a full, and/or multiple depths of build-up layers of the semiconductor package 600.

FIGS. 7A-7H depict simplified cross-sectional schematic diagrams of an example semiconductor packages 780 with programmable signal routing having four heating elements 712 for each solder well and a fabrication method therefor, in accordance with example embodiments of the disclosure. In example embodiments, the semiconductor package 780 may be similar to the semiconductor package 600 of FIG. 6. Although FIGS. 7A-7H depict a particular process flow and resulting semiconductor package with programmable signal routing, it will be appreciated that variations of the processes and structures are contemplated and encompassed by the disclosure as provide herein. For example, it will be appreciated that some processes may be performed in an order different from that depicted herein. As a further example, it will be appreciated that some processes may have suitable substitutes that may be implemented without deviating from embodiments of the disclosure.

The processes, as depicted herein, may be implemented to concurrently or nearly concurrently fabricate a plurality of semiconductor packages with programmable signal routing. Although a particular fabrication sequence is shown here with fabrication of various structures and/or features, both final and/or temporary, any variations for fabricating similar features may be implemented in accordance with example embodiments of the disclosure. Further still, there may be additional and/or fewer features than the features disclosed herein for the fabrication of the semiconductor package, in accordance with example embodiments of the disclosure. Although the cross-sections as depicted here show a single semiconductor package fabricated on a package substrate panel, it will be appreciated that there may be any number of semiconductor packages that are fabricated concurrently or nearly concurrently on a particular package substrate panel. Additionally, although an example embodiment of the sequence of processes for fabricating a semiconductor packages with programmable signal routing is depicted on a single package substrate panel, it will be appreciated that there may be any number of package substrate panels that may be processed concurrently and/or near concurrently through any of the processes depicted herein. For example, some processes may be batch processes where a particular unit may be processed along with another of that unit. In other cases, unit processes may be performed in a sequential manner on work-in-progress (WIP).

Figure 7A:
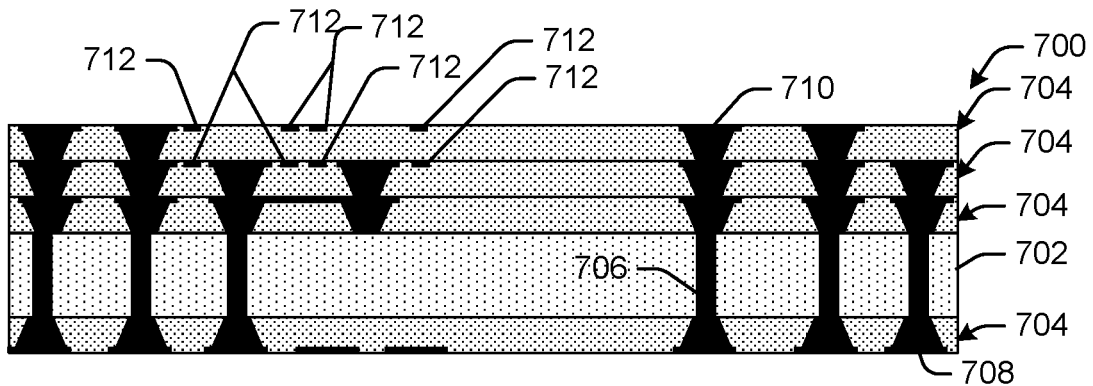
FIGS. 7A-7H depict simplified cross-sectional schematic diagrams of an example semiconductor packages with programmable signal routing having four heating elements for each solder well and a fabrication method therefor, in accordance with example embodiments of the disclosure.

In FIG. 7A, a package substrate may include a core 702 with one or more through-vias 706 and one or more build-up layers 704 thereon. The one or more build-up layers 704 may have various pads 708, 710 thereon, as well as the heating elements 712. The heating elements 712 may be formed on two different build-up layers. In other example embodiments, the heating elements may be formed on a single build-up layer, as shown in the semiconductor package with programmable signal routing 100 of FIG. 1. In some other example embodiments, there may be more than two build-up layers 104 on which heating elements are formed. The heating elements 712, in example embodiments, may be similar to metal traces 710, and may be fabricated concurrently with metal traces 710, such as with a reduced cross-sectional area (e.g., substantially normal to the direction of current flow) than other metal traces 710.

As discussed above, the build-up layers 704 may be fabricated with any suitable material, including, but not limited to, polymer material, ceramic material, plastics, composite materials, LCP, epoxy laminates of fiberglass sheets, FR-4 materials, FR-5 materials, combinations thereof, or the like. Again, in some example embodiments, the core 702 and all of the build-up dielectric may be the same type of material. In other example embodiments, the core 702 and at least one or more of the build-up dielectric layers may not be constructed of the same material types. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

Figure 7B:
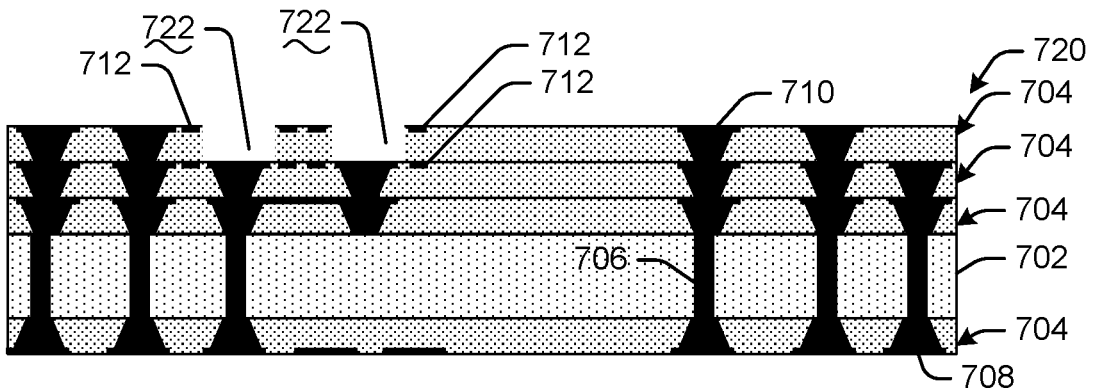

In FIG. 7B, a partially fabricated semiconductor package 720 may have one or more build-up layers 704 in which one or more cavities 722 may be formed. The cavities 722 may be formed by any suitable mechanism including, but not limited to, patterned wet etch, patterned dry etch, laser ablation, wet clean, combinations thereof, or the like. In some cases, the cavities 722 may be formed over metal traces in a underlying build-up layer, such that etch/laser selectivity may be used to remove build-up dielectric with a relatively high level of depth and/or bottom surface control.

Figure 7C:
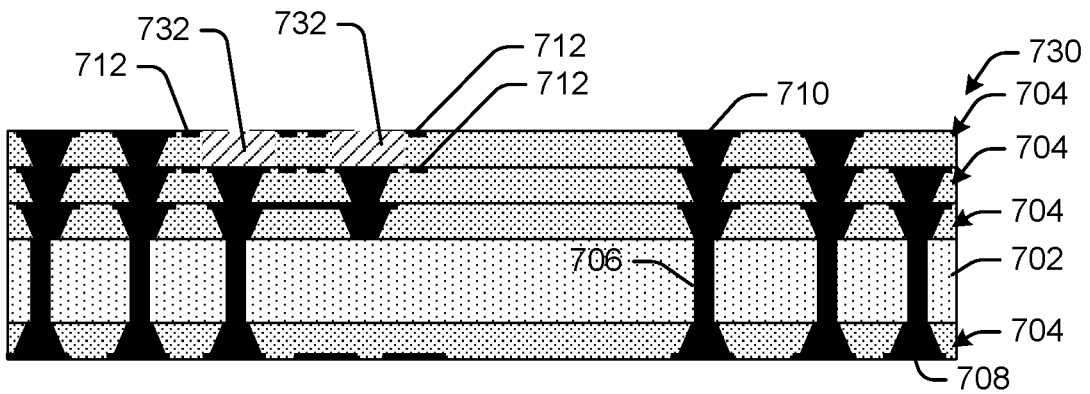

In FIG. 7C, a partially fabricated semiconductor package 730 may have one or more cavities 722 filled with metal to form metal wells 732. Any suitable metallurgy may be used for forming the metal wells 732, such as solder, tin alloys, tin intermetallic, lead-free solder, or the like. In some cases, conductive adhesive, such as conductive ink and/or conductive paste, may be used to form the metal wells 732. The conductive adhesive may be disposed in the cavities 722 by spin deposition, spray deposition, screen printing, squeegee process, and/or any other suitable deposition process. In the same or other example embodiments, the conductive adhesive may be forced into cavity 722 by mechanical force, such as by a squeegee process. In yet other example embodiments, the conductive adhesive may be preferentially deposited using a screen printing process, such as by aligning a patterned screen on top of the cavities 722. In some example embodiments, the amount of conductive adhesive deposited in the cavity 722 may be a predetermined amount, such as a predetermined amount based at least in part on the volume of each of the cavities 722. In other example embodiments, the metal in the metal wells 732 may be plated (e.g., electroplated, electroless plated, etc.). In yet further example embodiments, physical deposition and/or sputtering may be used to fill the cavities 722 with metal to form the metal wells 732. In some cases, if metal is deposited on a surface of the topmost build-up layer 704 outside of the cavities 722, an etch back process may be performed to clean any residual metal off of the surface of the semiconductor package 730. In example embodiments, a top surface of the metal well 732 may be substantially flush with a top surface of the top-most build-up layer 704 when the metal wells 732 are fabricated. In example embodiments, the metal of the metal wells 732 may be selected to melt at a lower temperature than any other metals used on the package (e.g., solder contacts between a die and the semiconductor package), so that when the metal of the metal wells 732 are melted, other metals in the system may not be inadvertently molten as well.

Figure 7D:
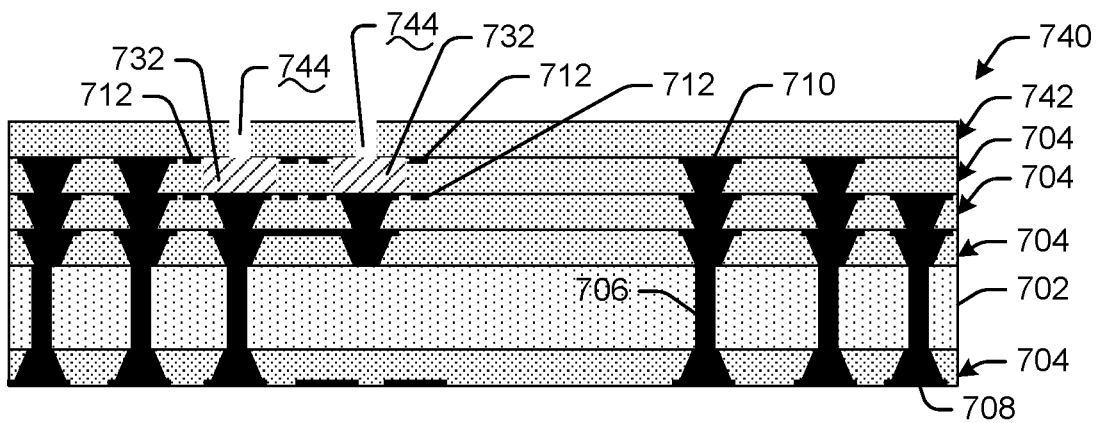

In FIG. 7D, a partially fabricated semiconductor package 740 may have one or more additional build-up layer(s) 742 fabricated over the topmost build-up layer 704 when the metal wells were fabricated. The additional build-up layer(s) 742 may be fabricated in a similar manner to how the other build-up layers 704 may be fabricated. After fabricating build up layer 742, gap(s) 744 may be formed over each of the metal wells. The gap(s) may be formed in a similar manner to the formation of the cavities 722 in FIG. 7B. If a laser, wet, etch, dry etch, and/or combinations thereof, are used, the build-up dielectric removal may be selective to removal of metal in the metal wells 732 in example embodiments.

Figure 7E:
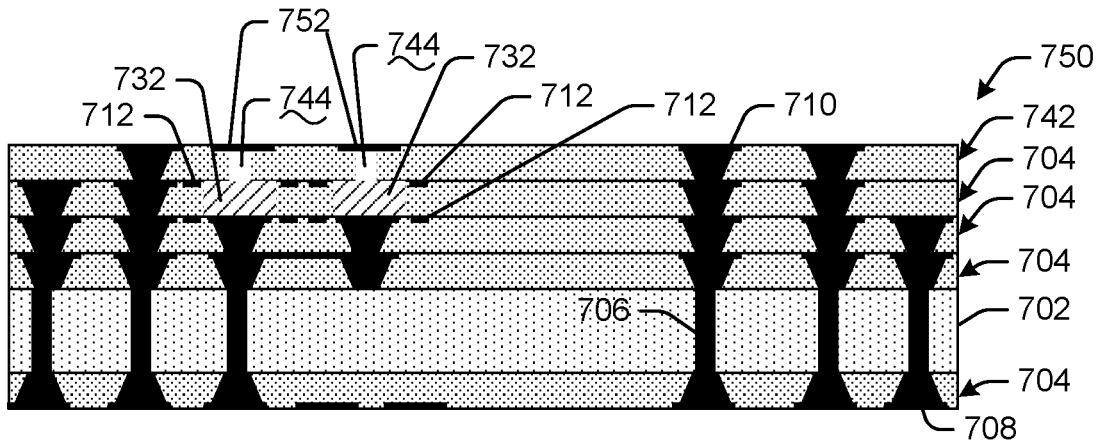

In FIG. 7E, a partially fabricated semiconductor package 750 may have one or more pads 752 fabricated on the additional build-up layer(s) 742. There may be additional metallic traces and/or pads formed along with pads 752, in example embodiments. Pads 752 may be connection points of the selectable/programmable routes of package 750. The pads 752 may be fabricated partially overlying the gaps 744. In some example embodiments, the pads 752 may be fabricated in a partial vacuum, so that the air pressure within the gaps 744 may be sub-atmosphere. For example, metal of the pads may be laminated in a partial vacuum environment. By having low pressure in the gaps 744, the molten metal may have reduced impediments, such as air compression in the gaps 744, to rise in the gaps 744. In some example embodiments, the gap 744 surface may be treated prior to fabricating the pads 752 thereon. In some cases, the surface and/or sidewalls of the gaps 744 may be treated, prior to or in-situ with the formation of the pads 752, to induce greater wicking action of molten metal on the sidewalls of the gaps 744. In some example embodiments, a roughening process, such as a plasma treatment and/or a aqueous treatment, may be performed to surface treat the sidewalls of the gaps 744 prior to formation of the pads 752.

Figure 7F:
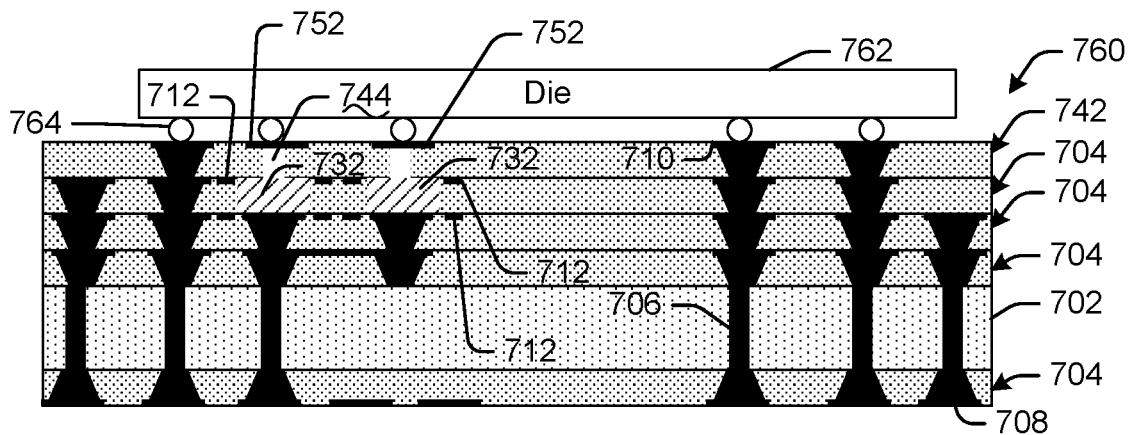

In FIG. 7F, a partially fabricated semiconductor package 760 may have one or more electronic components, such as a die 762 attached thereon using any variety of die-to-package interconnects 764. As shown, two or more of the die-to-package interconnect 764 may be connected the pads 752 that each represent different routing pathways. Thus in this case, one of two routes may be connected to the die 762.

The die 762 may be attached by any suitable mechanism. The die 762 may be any suitable electronic components, including, but not limited to, integrated circuits, surface mount devices, active devices, passive devices, diodes, transistors, connectors, resistors, inductors, capacitors, microelectromechanical systems (MEMS), combinations thereof, or the like. The die 762 may be electrically and mechanically coupled to the package substrate 760 via any suitable contact 764, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the type of contact 764 may be different for different dies. For example, one die may have copper pillar contacts and another die may have solder bump contacts. In other example embodiments, the different dies may have the same type of contacts but may have different dimensions of those contacts.

In some example embodiments, underfill material may be provided around the die-to-package contacts 764, between the die 762 and the build-up layer 742. Representative epoxy materials in the underfill may include an amine epoxy, imidizole epoxy, a phenolic epoxy or an anhydride epoxy. Other examples of underfill material include polyimide, benzocyclobutene (BCB), a bismaleimide type underfill, a polybenzoxazine (PBO) underfill, or a polynorbornene underfill. Additionally, the underfill material may include a filler material, such as silica. Underfill material may be introduced by spin coating, extrusion coating or spray coating techniques. In another embodiment, the underfill material includes a standard fabrication passivation material such as an inorganic passivation material (e.g., silicon nitride, silicon oxynitride) or organic passivation material (e.g., polyimide).

Although FIG. 7F illustrates a semiconductor package 760 having a single die 762, it will be appreciated that there may be any suitable number of dies or other electronic components disposed on the semiconductor package, such as in a System in a Package (SiP) configuration. In a non-limiting example, a SiP with programmable signal routing may have a microprocessor and one or memory dies disposed thereon. In another non-limiting example, a SiP with programmable signal routing may have a digital signal processor (DSP) die, a baseband die, a memory die, and a power amplifier die. Again, in this example, one or more of the die and/or connections to a die may be selectable and/or programmable, such as by using molten metal to establish connections in a channel gap where molten metal may migrate.

Although not shown here, molding may be disposed on the top surface of the build-up layer 742 and encapsulating the die 762. The molding material may be any suitable molding material. For example, the molding material may be a liquid dispensed thermosetting epoxy resin mold compound. The mold compound may be deposited on the surface of the build-up layer 742 using any suitable mechanism including, but not limited to, liquid dispense, spin coating, spray coating, squeegee, screen printing, combinations thereof, or the like. The mold compound, after dispense onto the top surface of the build-up layer 742, may be cured while pressure is applied thereon by a chase surface. In example embodiments, the chase (e.g., a relatively flat surface pressed on top of the liquid molding material disposed on top of the build-up layer) may itself be heated. Upon curing (e.g., cross-linking) the deposited molding compound may harden and form molding to adhere to the build-up layer 742 and encapsulating the die 762. In example embodiments, the molding may have fillers and/or other materials therein to preferentially control the coefficient of thermal expansion (CTE), reduce stresses, impart flame retardant properties, promote adhesion, and/or reduce moisture uptake in the molding. I some further example embodiments, an electromagnetic interference (EMI) shield and/or cover may be provided. In some cases, an EMI shield or cover may include a metal can. In some example embodiments, the molding may be provided in the metal can that is aligned and placed over die 762, and then the molding may be cured after placement of the EMI shield and molding.

Figure 7G:
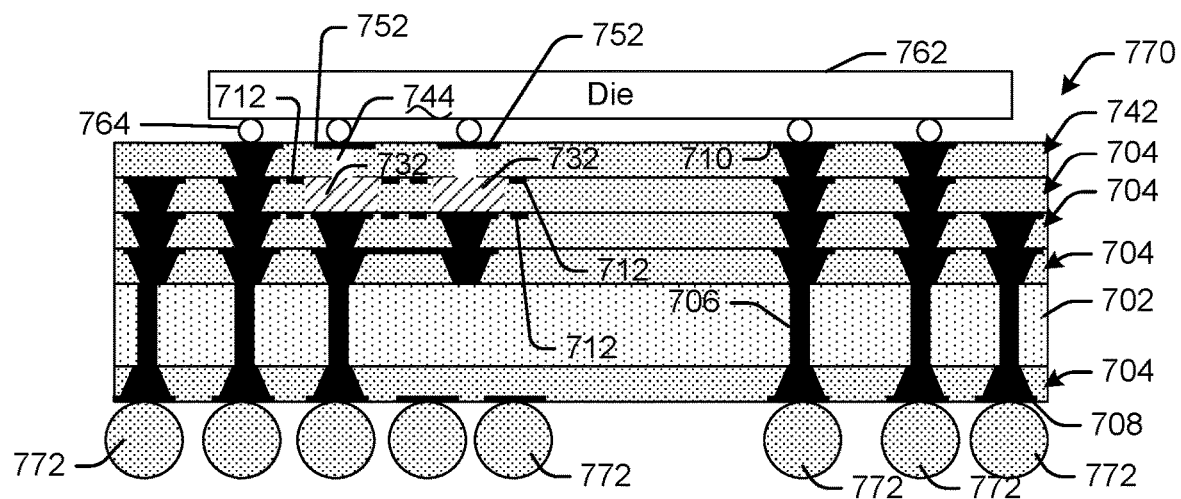
Figure 7H:
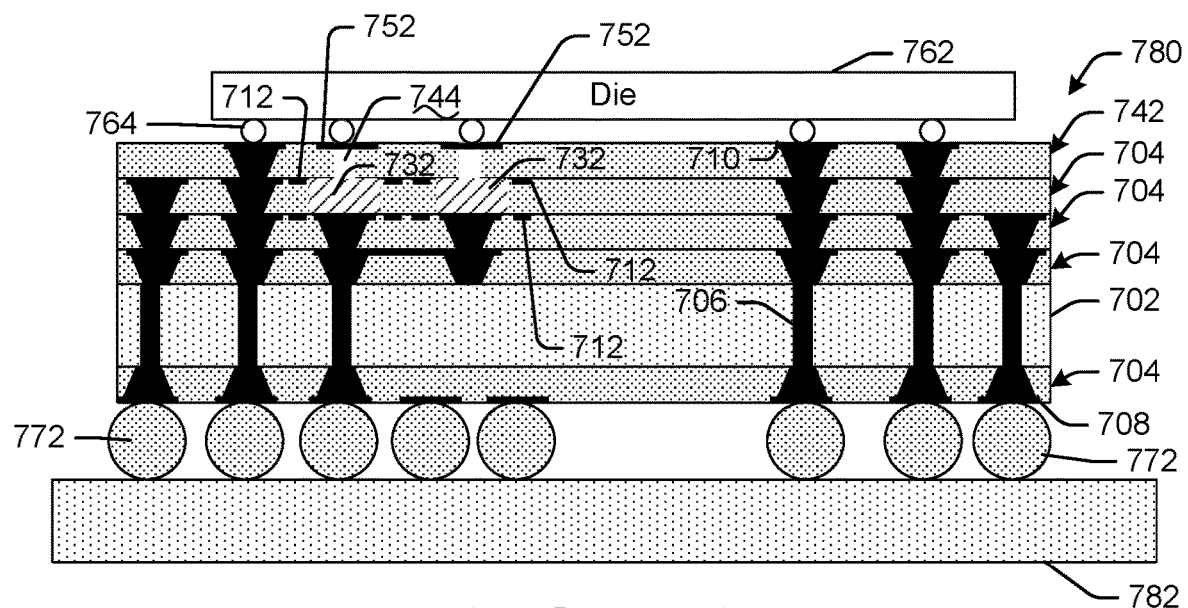

In FIG. 7G, a partially fabricated semiconductor package 770 may have one or more package-to-board interconnects 772 attached thereon. The contacts 252 may be any suitable contacts for semiconductor package-to-board interconnections, such as ball grid array (BGA) or other area array contacts. In FIG. 7H, a partially fabricated semiconductor package 780 may be assembled onto a board (e.g., a printed circuit board (PCB) using the package-to-board interconnects 772.

Figure 8:
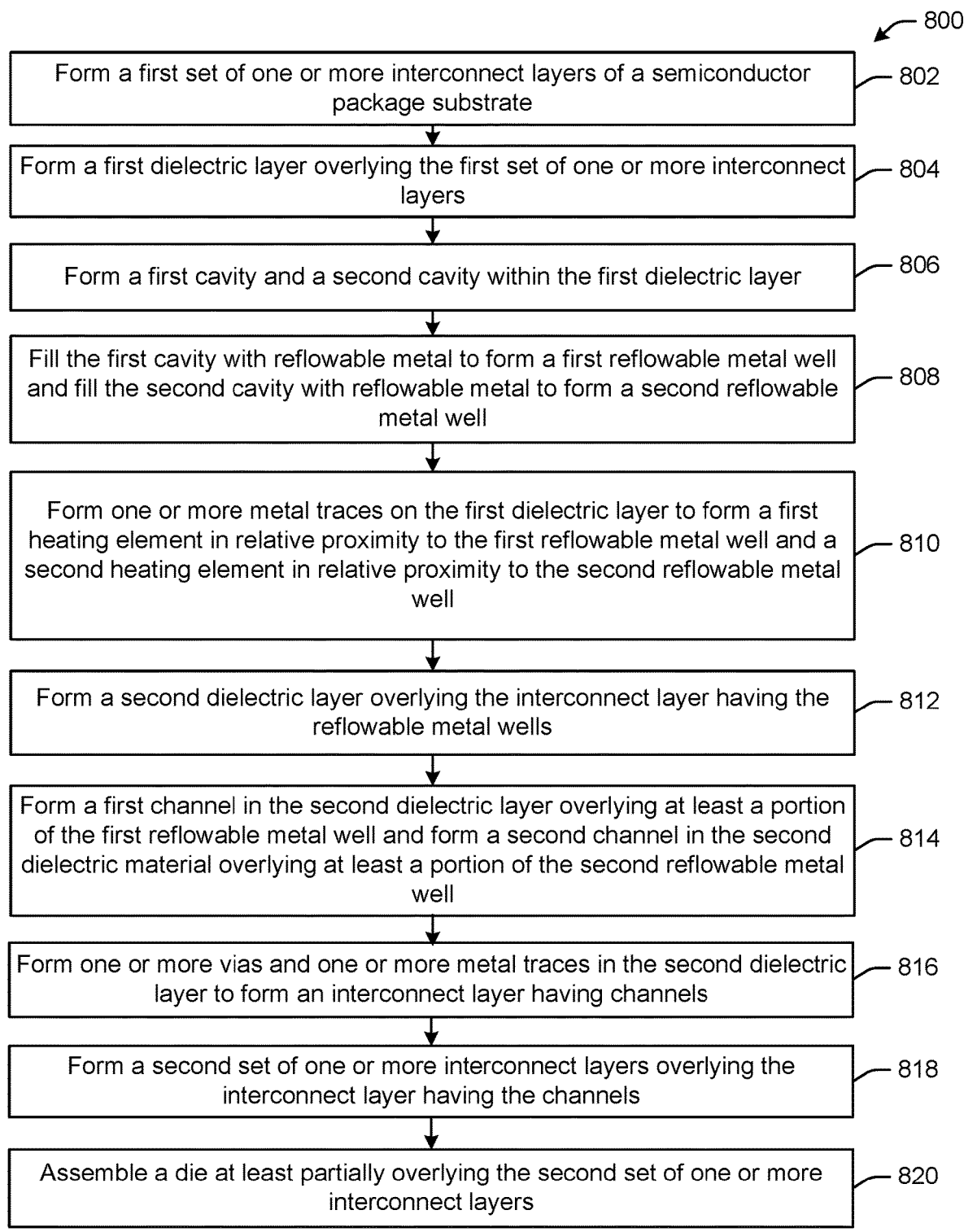
FIG. 8 depicts a flow diagram illustrating an example method for fabricating a semiconductor package with programmable signal routing, in accordance with example embodiments of the disclosure.

FIG. 8 depicts a flow diagram illustrating an example method 800 for fabricating a semiconductor package with programmable signal routing, in accordance with example embodiments of the disclosure. The fabrication processes, in example embodiments, may form a semiconductor package with programmable signal routing similar to that of FIG. 1. It will be appreciated that the processes discussed herein may be performed out of order and/or may be substituted with similar processes, in accordance with example embodiments of the disclosure.

At block 802, a first set of one or more interconnect layers of a semiconductor package substrate may be formed. These interconnect layers may be formed with or without a substrate core and may have a plurality of vias and/or electrical traces therein to route signals, ground, power, clock, or the like. At block 804, a first dielectric layer overlying the first set of one or more interconnect layers may be formed. The metal wells corresponding to two different signal routing may be formed in this dielectric layer. In example embodiments, this dielectric layer may be a build-up dielectric that may be laminated onto the surface of the partially formed package. At block 806, a first cavity and a second cavity may be formed in the first dielectric layer. As discussed above, the cavities may be formed using any suitable mechanism, including, for example, laser ablation, patterned wet etch, and/or dry etch. At block 808, the first and second metal wells may be filled with reflowable metal to form a first and second reflowable metal well, respectively. The metal provided in the cavities may be any suitable metal, including, for example, solder paste, tin allows, tin-copper, etc. At block 810, one or more metal traces to form a first heating element in relative proximity of the first heating element and a second heating element in relative proximity of the second heating element. These traces may be formed contemporaneously with other routing traces on the first dielectric layer. In example embodiments, the first and second heating elements may be similar to other metal traces, but with a relatively smaller cross-sectional area in a direction normal to current flow.

At block 812, a second dielectric layer may be formed overlying the interconnect layer having the relowable metal wells. This second dielectric layer, in example embodiments, may be the same material or a different material than the underlying first dielectric material. The second dielectric material may further be fabricated in a similar or in a different mechanism as the first dielectric layer and/or the first set of one or more interconnect layers. At block 814, a first channel may be formed in the second dielectric layer overlying at least a portion of the first reflowable metal well and a second channel may be formed overlying at least a portion of the second reflowable metal well. The channel or gap may be formed using any suitable mechanism, such as laser ablation, wet etch, and/or dry etch. In some cases, a multi-step process may be used to form the channel gap, and ensure that the gap opens up all the way to the metal well, with little or no dielectric residue at the bottom of the channel. In example embodiments, sidewalls of the channels may be surface treated to enhance surface wetting by molten metal of the metal wells. Such a surface treatment may involve surface roughening, surface smoothing, dielectric coating deposition on the sidewalls of the channel, metal coating on the sidewalls of the channel. If a metal coating is used, then a flash etch may be performed to ensure that the metal coating doesn't extend the full length of the channel, such as removing the metal coating at or near the top of the channel to prevent excessive leakage current in pathways that are not selected to be formed during the operation of the semiconductor package.

At block 816, one or more interconnect layers and/or metal traces may be formed over the second dielectric layer to form an interconnect layer having the channels. The interconnect layer having the channels may include one or more pads overlying the channels. These pads may overlying the channels may be part of the routing associated with the alternative routing options of the semiconductor package. For example, if the second dielectric layer is the topmost dielectric layer of the semiconductor package, then the pads may be bondpads on which one or more electrical components are assembled. In example embodiments, additional heating elements may be formed in relative proximity of the channels. Forming the additional heating elements may provide a configuration of heating element across more than one build-up layer, as depicted in FIG. 6.

At block 818, a second set of one or more interconnect layers may be formed overlying the interconnect layer having the channels. The processes of block 818 may be optional if the interconnect layer having the channels is the topmost interconnect layer of the semiconductor package. In that case the interconnect layer having the channels may have pads disposed over the channels that may be in the signaling path of the selectable routes. When the second set of interconnect layers are constructed, the processes used may be similar to the processes used to fabricate the first set of interconnect layers, such as dielectric lamination, via patterning, via hole formation, metal plating, metal trace patterning, metal etch, etc. At block 820, a die at least partially overlying the second set of one or more interconnect layers may be assembled. The dies may be any suitable electronic device, such as a semiconductor-based electronic device. In example embodiments, the die may be an integrated circuit (IC) with at least one active device (e.g., transistor, diodes, etc.) and/or passive device (e.g., resistors, inductors, capacitors, etc.). The die may be attached by any suitable mechanism and may further be electrically coupled, either by direct mechanical connection and/or routed connection through one or more interconnect layers, to one or more pads that may be formed over the channels of the alternative routing pathways. Thus, one or more nodes of the assembled die may be selectable (e.g., selectable/programmable routing) according to the apparatus, mechanisms, systems, and/or methods, as disclosed herein.

It should be noted, that the method 800 may be modified in various ways in accordance with certain embodiments of the disclosure. For example, one or more operations of method 800 may be eliminated or executed out of order in other embodiments of the disclosure. Additionally, other operations may be added to method 800 in accordance with other embodiments of the disclosure.

Figure 9:
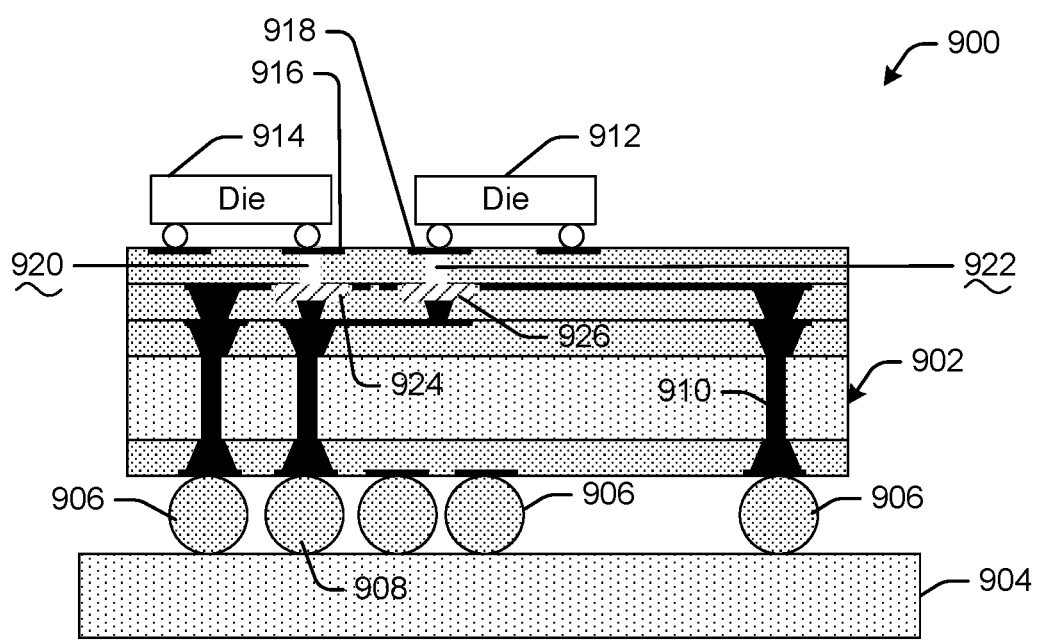
FIG. 9 depicts a simplified cross-sectional schematic diagram of an example semiconductor package with programmable signal routing to select between two different dies, in accordance with example embodiments of the disclosure.

FIG. 9 depicts a simplified cross-sectional schematic diagram of an example semiconductor package 900 with programmable signal routing to select between two different dies 912, 914, in accordance with example embodiments of the disclosure. The semiconductor package may have a substrate 902 with a core and a plurality of build-up layers assembled onto a board 904 with package to-board interconnects 906. The semiconductor package 900 may include a plurality of fixed electrical routings 910 and selectable pathways with channel gaps 920, 922 and metal wells 924, 926. As shown, the selection of a particular pathway may provide a connection to one die 914 through pad 916 or the other die 912 through pad 918. In some example embodiments, it may be more cost effective and/or logistically easier to mount various electronic components and activate one or more of them based at least in part on system needs. In other example embodiments, fault tolerance may be achieved by providing a connection to a similar electronic component after a first electronic component may have become defective (e.g., burned-out).

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages with programmable signal routing, as described herein. For example, microcontrollers, microprocessors, baseband processors, digital signal processors, memory die, field gate arrays, memory die, logic gate die, passive component die, MEMS, surface mount devices, application specific integrated circuits, baseband processors, amplifiers, filters, combinations thereof, or the like may be packaged in the semiconductor packages with programmable signal routing, as disclosed herein. The semiconductor packages with programmable signal routing, as disclosed herein may be provided in any variety of electronic device including, consumer, industrial, military, communications, infrastructural, and/or other electronic devices.

The semiconductor packages with programmable signal routing, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Braodwell®, Skylake®, etc.).

Additionally or alternatively, the semiconductor packages with programmable signal routing, as described herein, may be used to house one or more memory chips. The memory may include one or more volatile and/or non-volatile memory devices including, but not limited to, magnetic storage devices, read only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, or combinations thereof.

In example embodiments, the electronic device in which the semiconductor packages with programmable signal routing is provided may be a computing device. Such a computing device may house one or more boards on which the semiconductor packages with programmable signal routing may be disposed. The board may include a number of components, including but not limited to a processor and/or at least one communication chip. The processor may be physically and electrically connected to board through, for example, electrical connections of the semiconductor packages with programmable signal routing. The computing device may further include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a semiconductor package. The semiconductor package may include a first build-up layer, the first build-up layer having a source trace; a second build-up layer overlying the first build-up layer, the second build-up layer having a first metal well and a second metal well, the first metal well and the second metal well electrically coupled to the source trace; and a third build-up layer overlying the second build-up layer and defining a first gap overlying the first metal well and a second gap overlying the second metal well, the second build-up layer further having a first pad at least partially overlying the first gap and a second pad at least partially overlying the second metal well. In example embodiments, the semiconductor package may further include a die, wherein a first node of the die is electrically coupled to the first pad and a second node of the die is electrically coupled to the second pad. In further example embodiments, the first node is electrically coupled to the first pad using a die-to-package interconnect, wherein a melting point of the first metal well is less than a melting point of the die-to-package interconnect. In still further example embodiments, the semiconductor package may include a first die and a second die, wherein a first node of the first die is electrically coupled to the first pad and a second node of the second die is electrically coupled to the second pad. In yet further example embodiments, the second build-up layer further includes a first heating element and a second heating element.

According to example embodiments of the disclosure, the first heating element, when energized, is configured to heat the first metal well, wherein heating the first metal well results in melting metal in the first metal well. In some example embodiments, the third build-up layer further includes a third heating element and a fourth heating element, wherein the third heating element, when energized, is configured to heat the first gap, and wherein the fourth heating element, when energized, is configured to heat the second gap. In further example embodiments, the first metal well comprises at least one of: (i) solder paste; (ii) lead-free solder; or (iii) a tin alloy. In still further example embodiments, the first metal well and the second metal well are provided in contact with the source trace. In yet further example embodiments, a sidewall of the first airgap includes a metal coating. According to example embodiments, the semiconductor package includes one or more package-to-board interconnects, wherein a melting point of the first metal well is less than a melting point of the package-to-board interconnect.

According to example embodiments of the disclosure, there may be a method. The method may include forming a first build-up layer, the first build-up layer having a source trace; forming a second build-up layer overlying the first build-up layer; removing a first portion of the second build-up layer and a second portion of the second build-up layer; filling the first portion with a first metal to form a first metal well and filling the second portion with a second metal to form a second metal well; forming a third build-up layer overlying the second build-up layer; forming a first airgap over the first metal well and forming a second airgap over the second metal well; and forming a first pad over the first airgap and forming a second pad over the second airgap. In some example embodiments, forming the first build-up layer includes forming the first build-up layer on a topside of a package core. In further example embodiments, the method further includes attaching a first node of a die to the first pad and a second node of the die to the second pad. In still further example embodiments, the die comprises a die-to-package interconnect, and wherein a melting point of the first metal is greater than a melting point of the die-to-package interconnect. In some further example embodiments, removing the first portion of the second build-up layer further comprises at least one of: (i) laser ablating the first portion; (ii) wet etching the first portion; or (iii) dry etching the first portion. In yet further example embodiments, filling the first portion with the first metal to form the first metal well comprises disposing a solder paste in the first portion. According to example embodiments, forming the first airgap over the first metal well comprises laser ablating the first airgap. Further, in example embodiments, forming the first airgap over the first metal well comprises providing metal on a sidewall of the first airgap. In still further example embodiments, the second build-up layer further comprises forming a first heating element and a second heating element.

The claimed invention is:

1. A semiconductor package, comprising:
a first build-up layer, the first build-up layer having a source trace;
a second build-up layer overlying the first build-up layer, the second build-up layer having a first metal well and a second metal well, the first metal well and the second metal well electrically coupled to the source trace; and
a third build-up layer overlying the second build-up layer and defining a first gap overlying the first metal well and a second gap overlying the second metal well, the third build-up layer further having a first pad at least partially overlying the first gap and a second pad at least partially overlying the second metal well.

2. The semiconductor package of claim 1, further comprising a die, wherein a first node of the die is electrically coupled to the first pad and a second node of the die is electrically coupled to the second pad.

3. The semiconductor package of claim 2, wherein the first node is electrically coupled to the first pad using a die-to-package interconnect, wherein a melting point of the first metal well is less than a melting point of the die-to-package interconnect.

4. The semiconductor package of claim 1, further comprising a first die and a second die, wherein a first node of the first die is electrically coupled to the first pad and a second node of the second die is electrically coupled to the second pad.

5. The semiconductor package of claim 1, wherein the second build-up layer further includes a first heating element and a second heating element.

6. The semiconductor package of claim 5, wherein the first heating element, when energized, is configured to heat the first metal well, wherein heating the first metal well results in melting metal in the first metal well.

7. The semiconductor package of claim 5, wherein the third build-up layer further includes a third heating element and a fourth heating element, wherein the third heating element, when energized, is configured to heat the first gap, and wherein the fourth heating element, when energized, is configured to heat the second gap.

8. The semiconductor package of claim 1, wherein the first metal well comprises at least one of: (i) solder paste; (ii) lead-free solder; or (iii) a tin alloy.

9. The semiconductor package of claim 1, wherein the first metal well and the second metal well are provided in contact with the source trace.

10. The semiconductor package of claim 1, wherein a sidewall of the first gap includes a metal coating.

11. The semiconductor package of claim 1, further comprising one or more package-to-board interconnects, wherein a melting point of the first metal well is less than a melting point of the package-to-board interconnect.

12. A method, comprising:
forming a first build-up layer, the first build-up layer having a source trace;
forming a second build-up layer overlying the first build-up layer;
removing a first portion of the second build-up layer and a second portion of the second build-up layer;
filling the first portion with a first metal to form a first metal well and filling the second portion with a second metal to form a second metal well;
forming a third build-up layer overlying the second build-up layer;
forming a first airgap over the first metal well and forming a second airgap over the second metal well; and
forming a first pad over the first airgap and forming a second pad over the second airgap.

13. The method of claim 12, wherein forming the first build-up layer comprises forming the first build-up layer on a topside of a package core.

14. The method of claim 12, further comprising attaching a first node of a die to the first pad and a second node of the die to the second pad.

15. The method of claim 14, wherein the die comprises a die-to-package interconnect, and wherein a melting point of the first metal is greater than a melting point of the die-to-package interconnect.

16. The method of claim 12, wherein removing the first portion of the second build-up layer further comprises at least one of: (i) laser ablating the first portion; (ii) wet etching the first portion; or (iii) dry etching the first portion.

17. The method of claim 12, wherein filling the first portion with the first metal to form the first metal well comprises disposing a solder paste in the first portion.

18. The method of claim 12, wherein forming the first airgap over the first metal well comprises laser ablating the first airgap.

19. The method of claim 12, wherein forming the first airgap over the first metal well comprises providing metal on a sidewall of the first airgap.

20. The method of claim 12, wherein forming the second build-up layer further comprises forming a first heating element and a second heating element.

* * * * *